US011027481B2

(12) United States Patent
Mittendorfer

(10) Patent No.: US 11,027,481 B2
(45) Date of Patent: Jun. 8, 2021

(54) METHOD FOR TREATING MILLIMETRE AND/OR MICROMETRE AND/OR NANOMETRE STRUCTURES ON A SURFACE OF A SUBSTRATE

(71) Applicant: EV Group E. Thallner GmbH, St. Florian am Inn (AT)

(72) Inventor: Gerald Mittendorfer, Stuben (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 15/770,638

(22) PCT Filed: Oct. 25, 2016

(86) PCT No.: PCT/EP2016/075638
§ 371 (c)(1),
(2) Date: Apr. 24, 2018

(87) PCT Pub. No.: WO2017/076689
PCT Pub. Date: May 11, 2017

(65) Prior Publication Data
US 2018/0311889 A1 Nov. 1, 2018

(30) Foreign Application Priority Data
Nov. 5, 2015 (DE) .................. 10 2015 118 991.7

(51) Int. Cl.
*B29C 63/00* (2006.01)
*B32B 27/38* (2006.01)
(Continued)

(52) U.S. Cl.
CPC ............ *B29C 63/0013* (2013.01); *B32B 3/30* (2013.01); *B32B 7/06* (2013.01); *B32B 7/12* (2013.01);
(Continued)

(58) Field of Classification Search
CPC .... B32B 3/30; B32B 7/06; B32B 7/12; B32B 9/04; B32B 27/06; B32B 27/08;
(Continued)

(56) References Cited

U.S. PATENT DOCUMENTS 5,622,875 A * 4/1997 Lawrence ............... B24B 7/228
257/E21.214
6,051,298 A 4/2000 Ko et al.
(Continued)

FOREIGN PATENT DOCUMENTS

DE 3780387 T2 1/1993
DE 3780387 T2 1/1993
(Continued)

OTHER PUBLICATIONS

International Search Report from corresponding International Patent Application No. PCT/EP2016/075638, dated Jan. 12, 2017.

*Primary Examiner* — Michael P Wieczorek
(74) *Attorney, Agent, or Firm* — Kusner & Jaffe

(57) ABSTRACT

A method for treating a substrate having millimeter and/or micrometer and/or nanometer structures. The method includes applying at least one protective material to the structures, wherein the at least one protective material can be dissolved in a solvent, and the structures are produced by an imprinting process.

16 Claims, 4 Drawing Sheets

(51) Int. Cl.
| | | |
|---|---|---|
| *B32B 27/28* | (2006.01) | |
| *B32B 27/34* | (2006.01) | |
| *B32B 27/30* | (2006.01) | |
| *B32B 3/30* | (2006.01) | |
| *B32B 27/06* | (2006.01) | |
| *H01L 23/31* | (2006.01) | |
| *B32B 7/12* | (2006.01) | |
| *H05K 3/00* | (2006.01) | |
| *B32B 27/08* | (2006.01) | |
| *B32B 9/04* | (2006.01) | |
| *B32B 27/16* | (2006.01) | |
| *B32B 7/06* | (2019.01) | |

(52) U.S. Cl.
CPC ........... *B32B 9/04* (2013.01); *B32B 27/06* (2013.01); *B32B 27/08* (2013.01); *B32B 27/16* (2013.01); *B32B 27/281* (2013.01); *B32B 27/283* (2013.01); *B32B 27/285* (2013.01); *B32B 27/308* (2013.01); *B32B 27/34* (2013.01); *B32B 27/38* (2013.01); *H01L 23/3135* (2013.01); *H05K 3/0079* (2013.01); *B29C 2063/006* (2013.01); *B32B 2250/44* (2013.01); *B32B 2307/51* (2013.01); *B32B 2307/714* (2013.01); *B32B 2307/748* (2013.01); *B32B 2457/14* (2013.01); *H05K 3/007* (2013.01); *H05K 3/0085* (2013.01); *H05K 3/0097* (2013.01); *H05K 2203/0769* (2013.01); *H05K 2203/1361* (2013.01); *H05K 2203/1366* (2013.01); *H05K 2203/1383* (2013.01); *H05K 2203/1545* (2013.01); *H05K 2203/1563* (2013.01)

(58) Field of Classification Search
CPC ..... B32B 27/16; B32B 27/281; B32B 27/282; B32B 27/285; B32B 27/308; B32B 27/34; B32B 27/38; B29C 63/0013; B29C 71/00; B29C 59/02; B29C 59/04; B29C 59/022; B29C 59/026; B29C 59/023; B29C 2059/023; H01L 21/6835; H01L 21/6836; H01L 21/02697; B24B 37/013; B24B 49/10; B24B 49/12
USPC .......................... 264/134, 293; 427/154, 155
See application file for complete search history.

(56) References Cited

U.S. PATENT DOCUMENTS

| | | | | |
|---|---|---|---|---|
| 6,332,826 B1* | 12/2001 | Katsuoka | ............ | B24B 27/0023 451/173 |
| 6,872,598 B2* | 3/2005 | Liu | .......... | B24B 7/228 438/118 |
| 7,653,990 B2* | 2/2010 | Lee | ...... | H05K 3/0014 174/257 |
| 7,807,482 B2* | 10/2010 | Aspar | ........ | H01L 21/6835 257/E21.122 |
| 7,951,313 B2* | 5/2011 | Matsubayashi | ...... | D01D 5/0985 264/555 |
| 9,090,783 B2 | 7/2015 | Takanashi et al. | | |
| 9,170,485 B2* | 10/2015 | Ahn | ........ | G03F 7/0002 |
| 9,713,900 B2 | 7/2017 | Yamada et al. | | |
| 2004/0112880 A1 | 6/2004 | Sekiya | | |
| 2004/0142575 A1 | 7/2004 | Brewer | | |
| 2008/0016686 A1 | 1/2008 | Lee et al. | | |
| 2010/0109203 A1 | 5/2010 | Chen et al. | | |
| 2011/0236639 A1* | 9/2011 | Saifullah | ........ | B29C 59/022 428/156 |
| 2011/0290551 A1 | 12/2011 | Lee | | |
| 2012/0322241 A1 | 12/2012 | Holden et al. | | |
| 2013/0001826 A1 | 1/2013 | Ussing | | |
| 2013/0127090 A1* | 5/2013 | Yamada | ........ | B29C 33/40 264/293 |
| 2014/0116618 A1 | 5/2014 | Nakata et al. | | |
| 2014/0342530 A1* | 11/2014 | Yasuda | ........ | C09J 183/14 438/459 |
| 2015/0013917 A1 | 1/2015 | Inao et al. | | |
| 2015/0217505 A1 | 8/2015 | Fischer et al. | | |
| 2015/0309370 A1* | 10/2015 | Park | ........ | B29C 59/04 428/156 |
| 2018/0257295 A1 | 9/2018 | Fischer et al. | | |
| 2018/0311889 A1 | 11/2018 | Mittendorfer | | |

FOREIGN PATENT DOCUMENTS

| | | |
|---|---|---|
| DE | 69208692 T2 | 7/1996 |
| DE | 69208629 T2 | 9/1996 |
| DE | 10356766 A1 | 7/2004 |
| DE | 10356766 A1 | 7/2004 |
| DE | 102005048860 B4 | 5/2006 |
| DE | 102005048860 B4 | 12/2012 |
| DE | 102009018849 B4 | 6/2013 |
| DE | 102009018849 B4 | 6/2013 |
| DE | 102015116418 A1 | 3/2016 |
| DE | 102015116418 A1 | 3/2016 |
| EP | 0260994 A2 | 3/1988 |
| EP | 0260994 B1 | 7/1992 |
| EP | 0495746 B1 | 7/1992 |
| EP | 0549393 A1 | 6/1993 |
| JP | S62-042426 A | 2/1987 |
| JP | S6242426 A | 2/1987 |
| JP | S6242426 A | 2/1987 |
| JP | 2001102330 A | 4/2001 |
| JP | 2001102330 A | 4/2001 |
| JP | 2010165963 A | 7/2010 |
| JP | 2010165963 A | 7/2010 |
| JP | 2014162111 A | 9/2014 |
| KR | 1020100138043 | 12/2010 |
| TW | 201250806 A1 | 12/2012 |
| TW | 201250805 A1 | 5/2015 |
| WO | WO 2012/018048 A1 | 2/2012 |
| WO | WO 2012/018048 A1 | 2/2012 |
| WO | WO-2014/037044 A1 | 3/2014 |
| WO | WO 2014/037044 A1 | 3/2014 |
| WO | WO 2015/016685 A1 | 2/2015 |
| WO | WO 2016/045668 A1 | 3/2016 |
| WO | WO 2017/076689 A1 | 5/2017 |

* cited by examiner

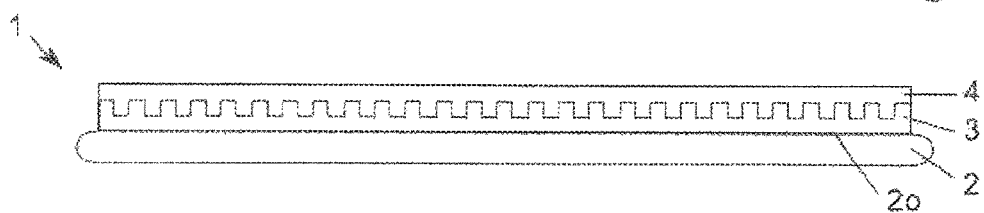
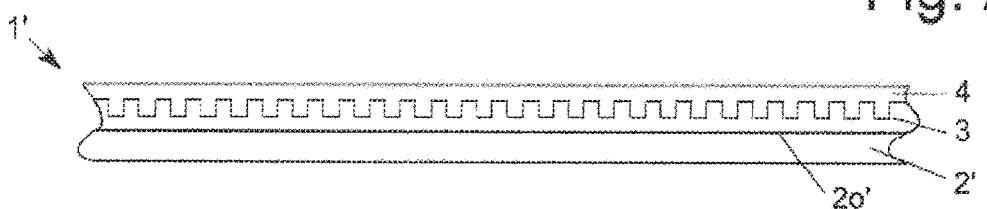
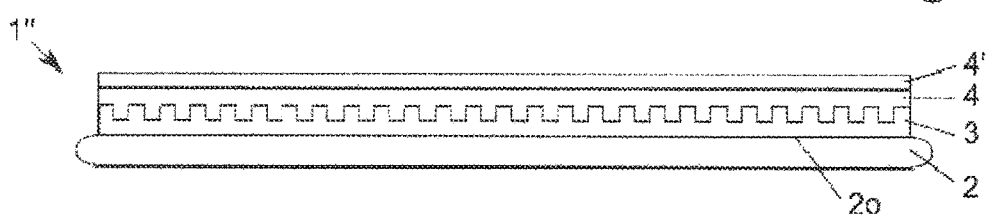

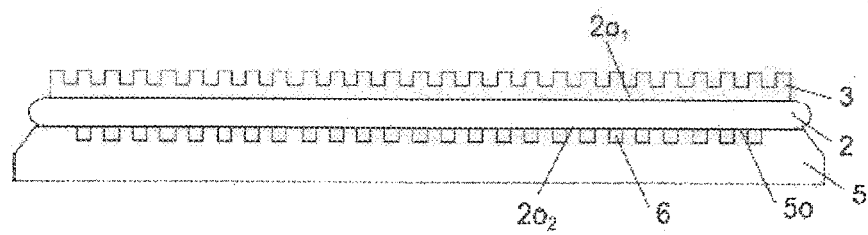
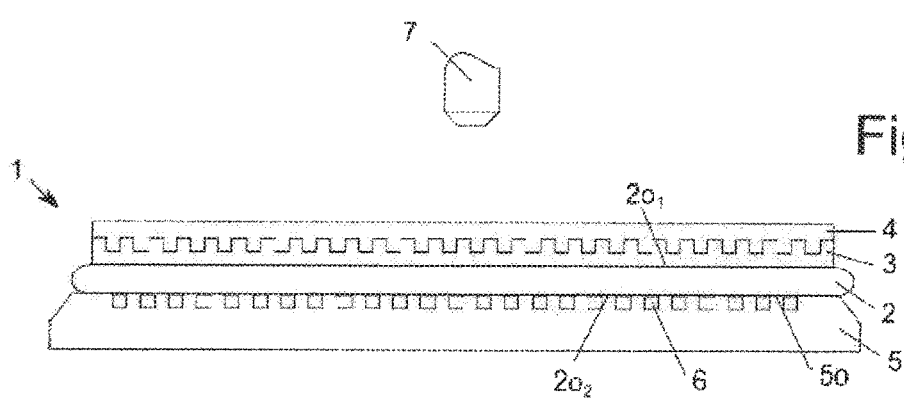
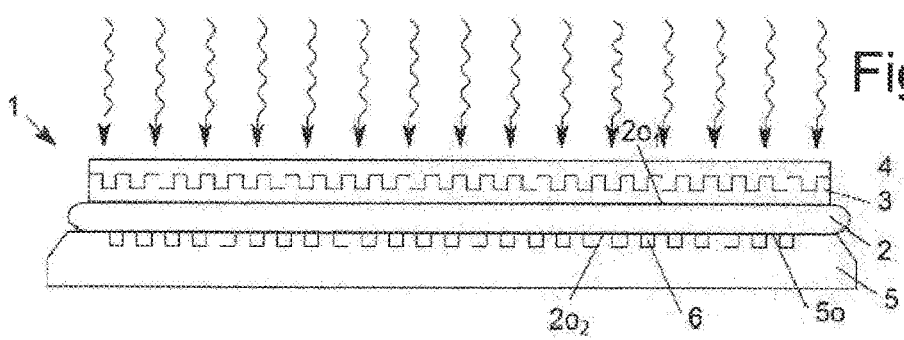

METHOD FOR TREATING MILLIMETRE AND/OR MICROMETRE AND/OR NANOMETRE STRUCTURES ON A SURFACE OF A SUBSTRATE

FIELD OF THE INVENTION

The present invention relates generally to a method for treating the surface of a substrate.

BACKGROUND OF THE INVENTION

Countless methods for treating the surface of substrates, in particular wafers, exist in the prior art. A very important aspect of the processing of substrates is constituted by processing on both sides. With processing on both sides, both sides of the substrate are treated, in particular in succession. Here, it is necessary to suitably protect the fixing side, i.e. the side that is not processed. The protection is necessary so as not to destroy the substrate side as a result of the fixing. In the prior art there exist many materials which are used for the protection of a substrate side during the fixing on a sample holder. These materials are preferably polymers, which, after application to the substrate upper side, are brought into a first state by chemical and/or physical process, which state optimally protects the structures of the fixed substrate side.

The problem with the materials lies in the removal thereof. Most materials are cured, in particular cross-linked, by chemical processes. This results in a certain tendency to adhere to the structures of the substrate surface. Furthermore, removal of the materials from the interstices of the structures becomes more difficult the longer is the polymer chain, the greater is the adhesive strength, and the greater the viscosity of the polymer.

SUMMARY OF THE INVENTION

The object of the present invention is to specify a method with which structures on a surface of a substrate can be optimally protected, but at a later moment in time a removal that is as simple as possible can be performed.

This object is achieved with the subject matter of the independent claim(s). Advantageous developments of the invention are specified in the dependent claims. All combinations of at least two features specified in the description, the claims and/or the drawings also fall within the scope of the invention, Where value ranges are specified, values lying within the specified limits are also disclosed as limit values and can be claimed in any combination.

In accordance with the invention a method for treating a substrate having millimetre and/or micrometre and/or nanometre structures is proposed, wherein at least one protective material is applied to the structures, wherein the at least one protective material can be dissolved in a solvent.

The process according to the invention allows the protection of a structured surface, in particular provided by 3D structures. The structured surface has been produced in particular by an imprint process. However, production by hot stamping processes, photolithographic processes, etching processes, etc. are also conceivable.

One or more structures worthy of protection is/are disposed on the substrate surface of the substrate. For the sake of simplicity, reference will usually be made hereinafter to structures in the plural. These structures can be microchips, MEMs, cavities, LEDs, stores, but in particular embossed structures. The structures are coated by a protective material according to the invention.

The concept according to the invention includes the use of a protective material-solvent combination. The protective material-solvent combination must be designed such that a solution of the protective material in the solvent is produced in an optimal manner in accordance with the principle "like mixes with like." Here, the solvent is used as a cleaning agent in order to remove the protective material from a substrate surface after a predefined number of process steps.

The protective material protects the structures from all types of loads which occur on the substrate surface and/or the opposing, second substrate surface. These include, for example, fixing processes, etching processes, grinding processes, polishing processes, structuring processes, in particular imprinting processes. In a very specific embodiment according to the invention, structures are in turn embossed on the second substrate surface so that a substrate embossed on two sides is obtained.

Following the processing of the structures of the second substrate surface, a coating according to the invention for protection of the structures can in turn be provided if necessary. A need exists particularly in the case of transport over long, in particular contaminated distances. The protective material according to the invention therefore serves not only as a mechanical stabiliser, but also as a protective layer for media, in particular fluids, even more specifically liquids or gases, in particular oxygen, occurring in the atmosphere and/or surrounding environment.

In accordance with an advantageous development, provision is made for the least one protective material to be arranged as at least one protective layer on the structures, wherein the at least one protective material preferably completely covers the structures. Improved protection of the structures is thus possible advantageously.

In accordance with another advantageous development, provision is made for the at least one protective material to be applied by centrifugal coating, spray coating, lamination and/or immersion. It is thus advantageously possible that the protective material can be applied particularly efficiently.

In accordance with another advantageous development, provision is made for the at least one protective material to be chemically and/or physically modified after the application, wherein this modification in particular comprises a hardening, an increase in viscosity and/or an increase in the elasticity of the at least one protective material. An improved protection of the structures can thus be achieved. The modification performed in this way in accordance with the invention still enables a most efficient and simple removal possible of the protective layer.

In accordance with another advantageous development, provision is made for a second protective material, in particular different from a first applied protective material, to be applied to said first protective material. Protective materials having different properties can thus be used advantageously, whereby the protection of the structures can be improved further still.

In accordance with another advantageous development, provision is made for a plurality of protective layers arranged above one another and comprising protective materials, which in particular are different, to be arranged over the structures. An improved protection of the structures can thus be achieved advantageously.

In accordance with another advantageous development, provision is made for the at least one protective material to comprise one of the following substances or a mixture of the following substances:
- paraffins, in particular
  - petrolatum
  - wax
    - ceresin
- polymers, in particular
  - photoresists in general
  - poly(methyl methacrylates)
  - poly(methyl glutarimides)
  - phenol formaldehyde resins, in particular
    - Bakelite
  - epoxies, in particular
    - SU-8
  - polyimides
  - polyamides
  - silanes
  - silicons
  - PDMS (protective film and removal material)
  - PFPE
  - acrylates.

In accordance with another advantageous development, provision is made for the at least one protective material to comprise one of the following substances or a mixture of the following substances:
- polyvinyl alcohol
- polyethers, in particular
  - polyethylene glycol
  - cellulose ethers
  - poly(2-ethyl-2-oxazolines)
- alcohols, in particular
  - glycerol, in particular
    - fats, in particular
      - triacylglycerols
- sugar
- carboxylic acid compounds in plastics
- benzotriazole.

In accordance with another advantageous development, provision is made for the at least one protective material to be dissolvable by one of the following solvents or by a solvent mixture of the following solvents:
- alkanes
- alkenes
- alkines
- aromatics, in particular
  - benzene
- carboxylic acid esters
- ethers, in particular
  - diethylether
- tetramethylsilane
- tetrahydrogen chloride
- carbon disulfide
- benzene
- chloroform
- gases, in particular
  - carbon monoxide.

In accordance with another advantageous development, provision is made for the at least one protective material to be dissolvable by one of the following solvents or by a solvent mixture of the following solvents:
- water
- alcohols, in particular
  - methanol, ethanol
- ketones, in particular
  - acetone
- amines, in particular
  - primary and secondary amines
- lactones
- lactams
- nitriles
- nitro compounds
- tertiary carboxylic acid amides
- urea derivatives
- sulfoxides
- sulfones, in particular
  - sulfolane
- carbonate esters, in particular
  - dimethyl carbonate
  - ethylene carbonate
- acids, in particular
  - mineral acids, in particular
    - sulfuric acid
    - halogen hydracids
  - organic acids, in particular
    - carboxylic acids, in particular
      - formic acid, acetic acid
- bases, in particular
  - NaOH, KOH
- gases
  - hydrogen
  - oxygen
  - nitrogen.

The use of gases allows in particular the decomposition and therefore removal of the protective material according to the invention by means of a reduction or oxidation process.

A further subject of the present invention relates to a facility for treating a substrate having millimetre, micrometre and/or nanometre structures, in particular for carrying out a method in accordance with one of the above embodiments, said facility comprising
  a) a fixing device for fixing the substrate,
  b) an application means, in particular a nozzle device having one or more nozzles and/or immersion bath, for applying at least one protective material to the structures, wherein the at least one protective material can be dissolved in a solvent.

Another subject of the present invention relates to a product, in particular produced with a method and/or a facility according to one of the above embodiments, comprising a substrate having millimetre and/or micrometre and/or nanometre structures and at least one coating on the structures formed from at least one protective material, wherein the at least one protective material can be dissolved by a solvent.

Another subject of the present invention relates to a method for processing a substrate, in particular a film, comprising at least the following steps:
  a) delivering the substrate by a delivery unit,
  b) applying and/or arranging, in particular on both sides of the substrate, millimetre and/or micrometre and/or nanometre structures on the substrate,
  c) applying, in particular on both sides of the substrate, at least one protective material to the structures, in particular using a method according to one of the above embodiments, wherein the at least one protective material can be dissolved in a solvent,
  d) receiving the substrate by a storage unit.

Another subject of the above invention relates to a facility for processing a substrate, in particular a film, comprising:
  a) a delivery unit for delivering the substrate, b) a processing unit for applying and/or arranging millimetre and/or micrometre and/or nanometre structures on the substrate, c) an application means for applying at least one protective material to the structures, in particular using a method according to one of the above embodiments, wherein the at least one protective material can be dissolved in a solvent, d) a storage unit for receiving the substrate.

In a further embodiment according to the invention, the protective material according to the invention is a nonpolar material. In accordance with the invention, the solvent preferably likewise has to be nonpolar.

In a further particularly preferred embodiment the protective layer material according to the invention is a polar material.

In accordance with the invention, the solvent preferably likewise has to be polar. In a very specific embodiment according to the invention the protective material according to the invention is polyvinyl alcohol and the solvent according to the invention is water.

In an extension of the specified embodiments according to the invention, a solvent mixture can be used instead of a solvent. Here, the solvent mixture is comprised of a combination of at least two of the above-mentioned solvents. In particular, one of the solvents is present in excess. Here, the mass fraction of the solvents occurring in excess is more than 50%, preferably more than 60%, even more preferably more than 70%, most preferably more than 80%, and most preferably of all more than 90%.

In an extension of the specified embodiments according to the invention, a protective material mixture can be used instead of a protective material, in particular a protective material mixture in which each individual protective material reacts selectively to a specific solvent. Here, the protective material mixture is comprised of a combination of at least two of the above-mentioned protective materials. In particular, one of the protective materials is present in excess. Here, the mass fraction of the protective material occurring in excess is more than 50%, preferably more than 60%, even more preferably more than 70%, most preferably more than 80%, and Most preferably of all more than 90%.

In an extension of the specified embodiments according to the invention, a plurality of layers of different protective materials can be applied to a substrate surface. These protective material combinations have, in particular, the advantage that different protective materials have different physical and/or chemical properties. In a first particularly preferred embodiment according to the invention a protective layer which has sufficient elastic properties is firstly applied in order to protect the structures present on the substrate surface against mechanical loading. A second protective layer, which in particular is resistant to chemical attacks, is disposed above the first protective layer.

The elastic properties of the protective material according to the invention are determined by the modulus of elasticity. Here, the modulus of elasticity is between 1 GPa, and 1000 GPa, preferably between 1 GPa and 500 GPa, with greater preference between 1 GPa and 100 GPa, with greatest preference between 1 GPa and 50 GPa, with greatest preference of all between 1 GPa and 20 GPa. The modulus of elasticity of polyamides is between 3 and 6 GPa, for example.

The protective material according to the invention must have an adhesion to the structures to be protected which ensures sufficiently high adhesive strength of the protective material according to the invention. The adhesion is preferably defined via the energy per unit area necessary to separate two interconnected surfaces from one another. The energy is specified here in J/m2. The energy per unit area here is greater than 0.0001 J/m2, preferably greater than 0.001 J/m2, more preferably greater than 0.01 J/m2, most preferably greater than 0.1 J/m2, most preferably of all greater than 1.0 J/m2, most favourably greater than 2.5 J/m2.

The surface roughness of the protective material according to the invention must be as low as possible so that the produced product can be fixed as optimally as possible on a sample holder via the protective material surface. The roughness is specified either as a mean roughness, square roughness, or as an averaged surface roughness. The ascertained values for the mean roughness, the square roughness, and the averaged surface roughness generally differ from one another for the same measurement distance or measurement area, but lie within the same range. The following numerical value ranges for the roughness are therefore to be understood either as values for the mean roughness, the square roughness, or for the averaged surface roughness. Here, the roughness is less than 10 µm, preferably less than 10 µm, even more preferably less than 1 µm, most preferably less than 100 nm, and most preferably of all less than 10 nm.

In an exemplary embodiment according to the invention the substrate is a wafer. The wafers are standardised substrates having well-defined, standardised diameters. However, the substrates can generally have any arbitrary form. The diameters of the substrates can generally adopt any arbitrary value, but usually have one of the standardised diameters of 1 inch, 2 inches, 3 inches, 4 inches, 5 inches, 6 inches, 8 inches, 12 inches, and 18 inches, or 25.4 mm, 50.8 mm, 76.2 mm, 100 mm, 125 mm, 150 mm, 200 mm, 300 mm or 450 mm.

In a specific embodiment the substrate can also be a die, in particular a soft die, of which the structures have to be protected, at least temporarily. By way of example, it would be conceivable that the die pattern of a die has to be protected for transport.

The substrates are processed primarily in modules for processing wafers, therefore in
    coating facilities, in particular
    centrifugal coating facilities,
    spray coating facilities
    bonders, in particular
    fusion bonders
    thermocompression bonders
    anodic bonders
    dicers
    grinders
    aligners
    roll imprinting facilities, in particular from WO2014/037044A1
    etc.

Here, the substrates are fixed on sample holders to the greatest possible extent. In the case of application by means of centrifugal coating, the sample holder is preferably a rotatably mounted sample holder. Here, the protective material is deposited on the structures with the aid of an application means. The application means is a nozzle, a hose, a pipe or any other arbitrary supply means which can deposit the protective material according to the invention.

In another embodiment according to the invention the substrate is a film. Here, the width of the film is greater than 10 mm, preferably greater than 100 mm, even more preferably greater than 500 mm, most preferably greater than 1000 mm, even more preferably greater than 1500 mm. The film has a thickness less than 2 mm, preferably less than 1 mm, even more preferably less than 0.5 mm, most preferably less than 0.1 mm, most preferably of all less than 0.01 mm.

The films are processed primarily in what are known as roll-to-roll facilities. A roll-to-roll facility has at least one loading unit, to which a wound film is fed. The roll-to-roll facility then guides the film via at least one first processing unit, in which a processing of at least one film surface is performed. In particular, even two film surfaces can be processed at the same time, in particular modified by imprint processes. The film is then guided via a further processing unit, in which the coating according to the invention is performed. Either a further processing of a film surface not yet protected can be performed, or the film is wound up again on a roll at the end of the roll-to-roll facility. In accordance with the invention, the film with the protected film surface can be transported without damaging structures. In a further processing facility, in particular a further second roll-to-roll facility, the protective layer can be removed. It is also conceivable for the film first to be trimmed into smaller units, in particular to wafer size and form, and for the protective material to be removed only following the cutting.

During the further course of the patent specification, reference will be made generally to substrates. In particular, the embodiments according to the invention relate to wafers.

In a first step of an exemplary method according to the invention, a substrate is fixed via its second, in particular flat, substrate surface to the surface of a sample holder. The fixing precedes in particular a processing of the first substrate surface. Here, the substrate is preferably fixed on a sample holder via its second substrate surface opposite the first substrate surface. Here, the fixing is provided with the aid of fixing means. The fixing means are constituted preferably by a vacuum fixing. Mechanical fixings, electrostatic fixings, magnetic fixings, or fixings by means of adhesive surfaces, which in particular are switchable, are also conceivable. The structures, in particular embossed structures, worthy of protection could in particular be processed and produced directly after the fixing of the substrate on the sample holder.

In a second process step a protective material according to the invention is applied to the first substrate surface. The protective material according to the invention can be applied by one of the following methods
    centrifugal coating
    spray coating
    lamination
    immersion.

In a third, optional process step, a chemical and/or physical modification of the protective material according to the invention can be performed, which changes the chemical and/or physical properties such that an improved protection in accordance with the invention of the structures of the first substrate surface is made possible. The modifications can be in particular one or more of the following methods
    curing, in particular by
    cross-linking of the polymers, in particular by
        electromagnetic waves, in particular by
            UV light
        thermal energy
        gases, in particular
            atmospheric gases
            vapours
    increase in viscosity, in particular by
    cross-linking of the polymers, in particular by
        electromagnetic waves, in particular by
            UV light
        thermal energy
    evaporation of the solvent
    increase in elasticity, in particular by
    cross-linking of the polymers, in particular by
        electromagnetic waves, in particular by
            UV light
        thermal energy.

The curing process is performed by electromagnetic radiation, in particular by UV light and/or by the action of thermal radiation. The electromagnetic radiation has a wavelength in the range between 10 nm and 2000 nm, preferably between 10 nm and 1500 nm, more preferably between 10 nm and 1000 nm, most preferably of all between 10 nm and 500 nm, most preferably of all between 10 nm and 400 nm. A heat treatment takes place at less than 750° C., preferably at less than 500° C., even more preferably at less than 250° C., most preferably at less than 100° C., most preferably of all at less than 50° C. A heat treatment is performed preferably by conducting heat through the sample holder. However, heating the surrounding atmosphere or a combination thereof is also conceivable.

Due to the optional third process step according to the invention, the protective material according to the invention is modified so that it withstands in particular a mechanical loading, in particular a normal force or a normal pressure. A further concept according to the invention comprises primarily in the fact that the protective material according to the invention does not fully forward the mechanical loading to the structures surrounding said protective material, but, as an elastic spring element, keeps the co-ordinated mechanical loading away from the structures of the first substrate surface to the greatest possible extent. A further aspect according to the invention of the protective material according to the invention is its protective property against chemicals, in particular liquids and/or gases or liquid and/or gas mixtures. In particular, the protective material according to the invention should be resistant to acid and/or bases and should prevent oxidation of the structures of the first substrate surface.

In a fourth process step the substrate with the protected first substrate surface can be fixed to the surface of a sample holder, in particular a second sample holder. The second side of the substrate can then be processed. In particular, this processing is again constituted by the production of structures by an embossing process.

Should the processed second side likewise be worthy of protection, in particular when the processed substrates are transported over long distances and/or in aggressive atmospheres, the second side is then also coated with the protective material. Here, the same coating technique as used with a coating of the first substrate side is preferably used.

In a further process step, the entire product can be transported and/or stored.

In a last process step the protective material according to the invention is removed using appropriate solvent. This is achieved in accordance with the invention in particular by purely wet-chemical treatment. The concept according to the invention comprises in particular in using exclusively protective material-solvent combinations width which the protective material is removed without additional chemicals, heat or radiation, in particular even only at room temperature. The concept according to the invention comprises in particular in the fact that the materials forming the protective material-solvent combination are co-ordinated with one another so that the polar or nonpolar nature of the materials matches, and therefore the materials are either both polar or both nonpolar materials. In the most preferred embodiment according to the invention, polyvinyl alcohol is used as protective material and water is used as solvent.

Process Flow of a Film Substrate

In a first process step according to the invention a film substrate is unwound from a first storage unit, in particular a roll.

In a second process step according to the invention the processing, in particular structuring, of a first substrate film surface is performed. The structuring is in particular an embossing, in particular by one or more embossing rolls. The processing, in particular the embossing, can be performed on one or two sides.

In a third process step according to the invention the structured first substrate film surface is protected in accordance with the invention by the protective material according to the invention. The protective material according to the invention is either applied by a spray coating, or the entire film is passed through an immersion bath.

In a last process step in accordance with the invention the film is stored, in particular on a further roll. It is also conceivable that the film is directly cut and further processed.

BRIEF DESCRIPTION OF THE DRAWINGS

Further advantages, features and details of the invention will emerge from the following description of preferred exemplary embodiments and also on the basis of the drawings.

FIG. 2 shows a second embodiment according to the invention of a product with a protective material on a substrate surface of a film, FIG. 3 shows a first embodiment according to the invention of a product with two protective materials on a substrate surface of a wafer, FIG. 4a shows a first process step of an exemplary process according to the invention, FIG. 4b shows a second process step of an exemplary process according to the invention, FIG. 4c shows a third, optional process step of an exemplary process according to the invention.

DETAILED DESCRIPTION OF THE INVENTION

Figure 4D:
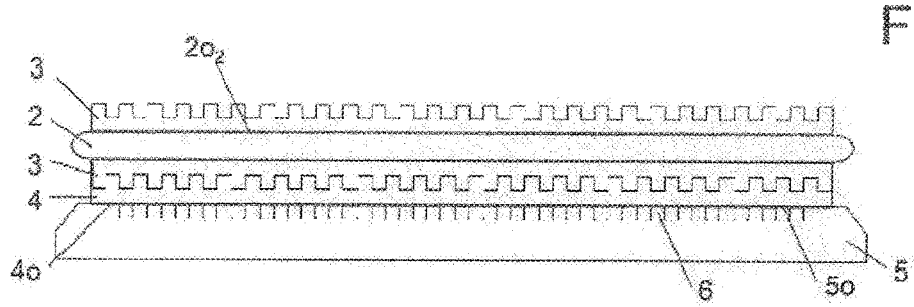
FIG. 4d shows a fourth process step of an exemplary process according to the invention.

FIG. 1 shows a first embodiment according to the invention of a first product 1 according to the invention on a substrate 2, in particular a wafer.

FIG. 2 shows a second embodiment according to the invention of a second product 1' according to the invention on a substrate 2', in particular a film. A structure 3 worthy of protection, in particular a structured structure, is disposed on the substrate surface 2o' of the substrate 2'.

The structure 3 can be constituted by microchips, MEMs, cavities, LEDs, stores, but in particular embossed structures. The structures 3 are coated with a protective material 4 according to the invention.

FIG. 3 shows a third embodiment according to the invention of a third product 1" according to the invention on a substrate 2, in particular a wafer. A structure 3 worthy of protection, in particular a structured structure, is disposed on the substrate surface 2o of the substrate 2. The structure 3 can be constituted by microchips, MEMs, cavities, LEDs, stores, but in particular embossed structures. The structures 3 are coated with a first protective material 4 according to the invention. A second protective material 4', which in particular is different from the first protective material 4, is disposed above the first protective material 4 according to the invention.

FIG. 4a shows a substrate 2, in particular a wafer, having a structure 3 worthy of protection, in particular a structured structure, on a first substrate surface 2o1 in a first process step according to the invention. Here, the substrate 2 is preferably fixed on a sample holder 5 via its second substrate surface 2o2 opposite the first substrate surface 2o1. Here, the fixing is provided with the aid of fixing means 6. The fixing means are preferably constituted by a vacuum fixing. Mechanical fixings, electrostatic fixings, magnetic fixings, or fixings by means of adhesive surfaces, which in particular are switchable, are also conceivable. The structures 3, in particular embossed structures, worthy of protection could in particular be processed and produced directly after the fixing of the substrate 2 on the sample holder 5.

FIG. 4b shows a second process step according to the invention in which a protective material 4 according to the invention is deposited on the structures 3, in particular embossed structures, worthy of protection. The preferred application methods according to the invention are centrifugal coating and/or spray coating.

FIG. 4c shows a third process step, that is a chemical and/or physical modification of the protective material according to the invention. The chemical and/or physical modification is in particular a curing process.

After the chemical and/or physical modification, the substrate 2 can be fixed via its cured protective material 4 on the sample holder so that the second substrate surface 2o2 can be processed, if necessary and/or desired.

As a result of the protection according to the invention of the structures 3 with the aid of the protective material 4, a fixing of the protective material surface 4o to a sample holder 5, in particular the same sample holder as in the previous process steps is therefore possible in accordance with FIG. 4d. The protective material 4 protects the structures 3 against all types of loading which occur on the substrate surface 2o2. These include, for example, etching processes, grinding processes, polishing processes, structuring processes, in particular imprinting processes. In a very specific embodiment according to the invention, structures 3 are in turn embossed on the second substrate surface, such that a substrate embossed on two sides is obtained.

Figure 4E:
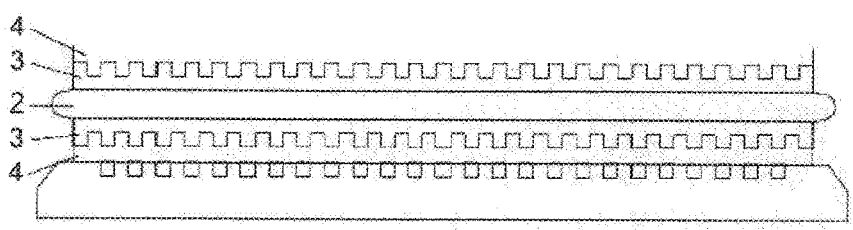
FIG. 4e shows a fifth process step of an exemplary process according to the invention.

After the processing of the structures 3 of the second substrate surface 2o2, a coating according to the invention for protection of the structures can in turn be provided in accordance with FIG. 4e if necessary. A need exists particularly in the case of transport over long, in particular contaminated distances. The protective material 4 according to the invention therefore serves not only as a mechanical stabiliser, but also as a protective layer for media, in particular fluids, even more specifically liquids or gases, occurring in the atmosphere and/or surrounding environment.

Figure 4F:
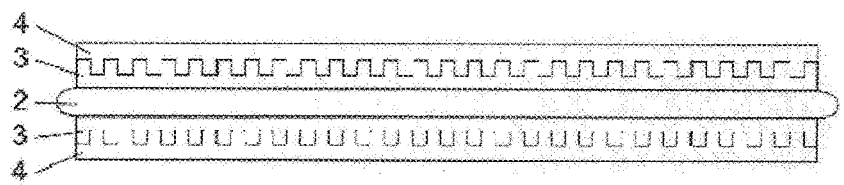
FIG. 4f shows a sixth process step of an exemplary process according to the invention.
Figure 4G:
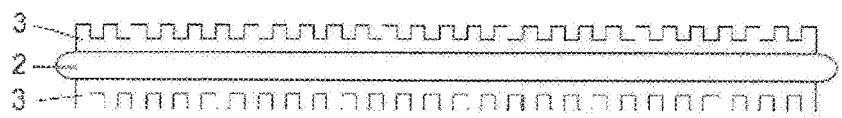
FIG. 4g shows a seventh process step of an exemplary process according to the invention.
Figure 5:
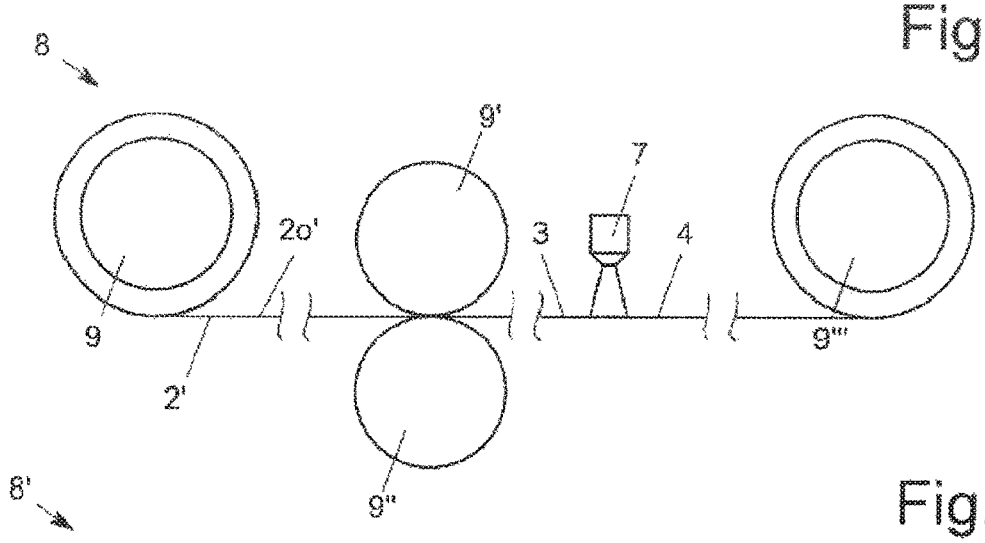
FIG. 5 shows a schematic illustration of a first exemplary roll-to-roll facility according to the invention.

The resultant product 1''' according to FIG. 4f, which product is in particular processed on two sides, can then be transported.

FIG. 0.5 shows a first embodiment of a roll-to-roll facility 8, which produces a product according to the invention. The substrate 2' is unwound from a first roll 9 and is processed at least on one side at the surface 2o'. The processing can be carried out for example by an embossing roll 9', which embosses a structure 3 on the substrate surface 2o'. The embossing roll 9' can be set against a counter pressing roll 9''. The structures 3 of the substrate 2' processed on one side are protected in accordance with the invention in a further process step by an application means 7. Further optional process steps and lastly a storage of the substrate 2' on a storage roll/winding roll 9''' are then performed.

Figure 6:
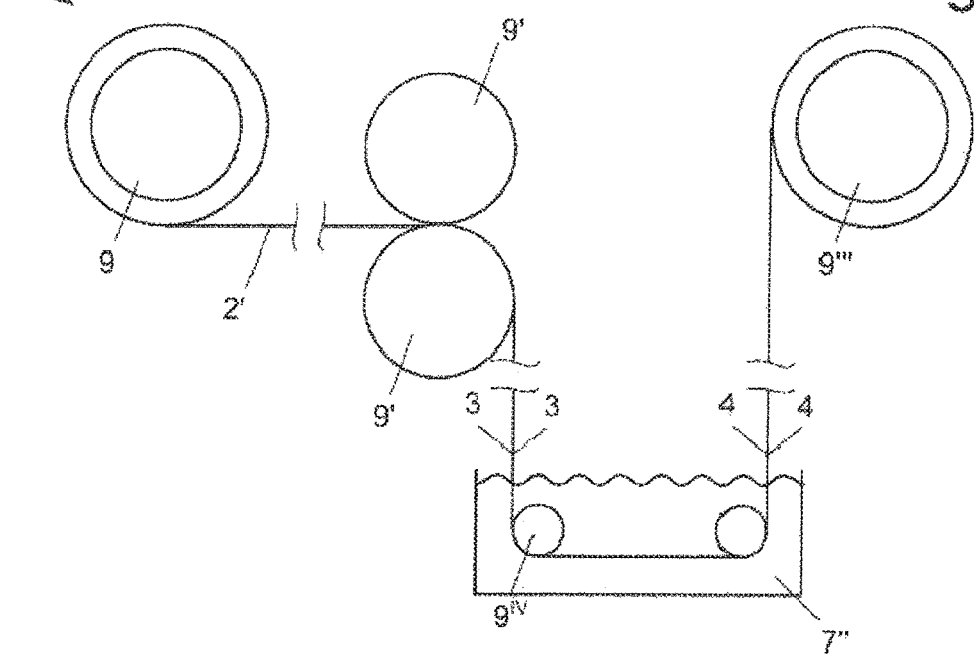
FIG. 6 shows a schematic illustration of a second exemplary roll-to-roll facility according to the invention.

FIG. 6 shows a second embodiment of a roll-to-roll facility 8', which produces a product according to the invention. The substrate 2' is unwound from a roll 9 and passes via processing units, in particular embossing rolls 9', into an application means 7. The application means 7' is preferably a bath with transport rolls 9$^{IV}$ However, a two-sided coating with the aid of application means 7, in particular nozzle devices, is also conceivable. The substrate 2', coated in particular on both sides, is then wound up again and stored on a roll 9'''.

LIST OF REFERENCE SIGNS

1, 1', 1'', 1''' product according to the invention
2, 2' substrate
2o, 2o' substrate surfaces
2o1, 2o2 substrate surfaces
3 structure
4, 4' protective material
4o protective material surface
5 sample holder
5o sample holder surface
6 fixing means
7, 7' application means
8, 8' roll-to-roll facility
9, 9', 9'', 9''', 9$^{IV}$ roll Having described the invention, the following is claimed:

1. A method for treating a substrate having a first surface and a second surface, wherein the method comprises:
   providing a substrate having millimetre and/or micrometre and/or nanometre structures on at least the first surface, wherein the structures are produced by an imprinting process;
   applying at least one mechanical stabilizer to the structures on the first surface, wherein the at least one mechanical stabilizer provides mechanical protection from loads and can be dissolved in a solvent, wherein the at least one mechanical stabilizer is applied by at least one of centrifugal coating, spray coating or immersion;
   fixing the first surface having the at least one mechanical stabilizer applied thereto to a sample holder, wherein fixing includes directly fixing one of the at least one mechanical stabilizer to the sample holder, and using at least one of a vacuum fixing, an electrostatic fixing or a magnetic fixing to directly fix a portion of the one of the at least one mechanical stabilizer applied by centrifugal coating, spray coating or immersion to the sample holder; and
   processing the second surface while the first surface is fixed to the sample holder.

2. The method according to claim 1, wherein the method comprises arranging the at least one mechanical stabilizer as at least one protective layer on the structures, the at least one mechanical stabilizer fully covering the structures.

3. The method according to claim 1, wherein the method further comprises:
   chemically and/or physically modifying the at least one mechanical stabilizer after applying the at least one mechanical stabilizer to the structures, the chemical and/or physical modification comprises a curing, an increase in viscosity and/or an increase in elasticity of the at least one mechanical stabilizer.

4. The method according to claim 1, wherein applying at least one mechanical stabilizer comprises applying a first protective material and a second protective material to the structures, wherein the second protective material is different from the first applied protective material, said first protective material applied directly to the structures and the second protective material applied to the first protective material.

5. The method according to claim 1, wherein applying at least one mechanical stabilizer comprises applying a plurality of protective materials to the structures as a plurality of protective layers, said plurality of protective layers arranged above one another, wherein each protective material is a different protective material.

6. The method according to claim 1, wherein the at least one mechanical stabilizer comprises one of the following substances or a mixture of the following substances: paraffins and polymers.

7. The method according to claim 6, wherein the polymers are selected from the group consisting of photoresists, poly (methyl methacrylates), poly (methyl glutarimides), phenol formaldehyde resins, epoxies, polyimides, polyamides, silanes, silicons, PDMS (protective film and removal material), PFPE, and acrylates.

8. The method according to claim 1, wherein the at least one mechanical stabilizer comprises one of the following substances or a mixture of the following substances: polyvinyl alcohol, polyethers, cellulose ethers, poly (2-ethyl-2-oxazolines), alcohols, sugar, carboxylic acid compounds in plastics, and benzotriazole.

9. The method according to claim 1, wherein the at least one mechanical stabilizer can be dissolved by one of the following solvents or by a solvent mixture of the following solvents: alkanes, alkenes, alkines, aromatics, carboxylic acid esters, ethers, tetramethylsilane, tetrahydrogen chloride, carbon disulfide, benzene, chloroform, and carbon monoxide.

10. The method according to claim 1, wherein the at least one mechanical stabilizer can be dissolved by one of the following solvents or by a solvent mixture of the following solvents: water, alcohols, ketones, amines, lactones, lactams, nitriles, nitro compounds, tertiary carboxylic acid amides, urea derivatives, sulfoxides, sulfones, carbonate esters, acids, formic acid, acetic acid, bases, hydrogen, oxygen, and nitrogen.

11. The method according to claim 1, wherein fixing the first surface having the at least one mechanical stabilizer applied thereto to a sample holder comprises placing the first surface to face toward the sample holder and placing the second surface to face away from the sample holder.

12. The method of claim 1, wherein the at least one mechanical stabilizer provides protection from a force normal to the first surface.

13. The method according to claim 1, wherein the at least one mechanical stabilizer directs mechanical loading away from the structures on the first surface.

14. A method for processing a substrate, said method comprising:
 a) delivering a substrate by use of a delivery unit, the substrate having first and second surface;
 b) applying and/or arranging, millimetre and/or micrometre and/or nanometre structures on at least the first surface of the substrate, wherein the structures are produced by an imprinting process;
 c) applying at least one mechanical stabilizer to the structures on the first surface, wherein the at least one mechanical stabilizer provides mechanical protection from loads and can be dissolved in a solvent, wherein the at least one mechanical stabilizer is applied by at least one of centrifugal coating, spray coating or immersion;
 d) fixing the first surface having the at least one mechanical stabilizer applied thereto to a sample holder, wherein fixing includes directly fixing one of the at least one mechanical stabilizer to the sample holder, using at least one of a vacuum fixing, an electrostatic fixing or a magnetic fixing to directly fix a portion of the one of the at least one mechanical stabilizer applied by centrifugal coating, spray coating or immersion to the sample holder;
 e) processing the second surface while the first surface is fixed to the sample holder; and
 f) receiving the substrate at a storage unit.

15. The method according to claim 14, wherein the structures are applied to the first and second surfaces of the substrate.

16. The method according to claim 14, wherein fixing the first surface having the at least one mechanical stabilizer applied thereto to a sample holder comprises placing the first surface to face toward the sample holder and placing the second surface to face away from the sample holder.

* * * * *